United States Patent
Noguchi et al.

(10) Patent No.: US 9,510,451 B2
(45) Date of Patent: Nov. 29, 2016

(54) LAMINATED ELECTRIC INDUCTOR

(71) Applicant: TOKO, Inc., Saitama-ken (JP)

(72) Inventors: Yutaka Noguchi, Saitama-ken (JP);
Makoto Yamamoto, Saitama-ken (JP);
Takeshi Kobayashi, Saitama-ken (JP)

(73) Assignee: TOKO, Inc., Saitama-ken (JP)

( * ) Notice: Subject to any disclaimer, the term of this patent is extended or adjusted under 35 U.S.C. 154(b) by 0 days.

(21) Appl. No.: 14/326,933

(22) Filed: Jul. 9, 2014

(65) Prior Publication Data
US 2015/0014042 A1   Jan. 15, 2015

(30) Foreign Application Priority Data
Jul. 9, 2013   (JP) .................................. 2013-143315

(51) Int. Cl.
*H05K 1/16* (2006.01)

(52) U.S. Cl.
CPC ..... *H05K 1/165* (2013.01); *H05K 2201/09845* (2013.01)

(58) Field of Classification Search
CPC .......................... H01F 17/0013; H05K 1/0298
USPC .......................................... 174/262; 336/200
See application file for complete search history.

(56) References Cited

U.S. PATENT DOCUMENTS

2013/0200980 A1*   8/2013   Yokoyama et al. ........... 336/200
2013/0223033 A1*   8/2013   Mano et al. .................. 361/763

FOREIGN PATENT DOCUMENTS

| JP | H05-57817 U | 7/1993 |
|---|---|---|
| JP | H08-130115 A | 5/1996 |
| JP | 2001-044038 A | 2/2001 |
| JP | 2004-014885 A | 1/2004 |
| JP | 2009-044030 A | 2/2009 |
| JP | 4973996 B2 | 7/2012 |

OTHER PUBLICATIONS

Office Action in counterpart Japanese Patent Application No. 2013-143315 issued Jun. 2, 2015 (3 pages).

* cited by examiner

*Primary Examiner* — Hoa C Nguyen
*Assistant Examiner* — Stanley Tso
(74) *Attorney, Agent, or Firm* — Osha Liang LLP

(57) ABSTRACT

A laminated electronic component is configured such that insulator layers and conductor patterns are laminated and a coil is formed in a laminate of the insulator layers and the conductor patterns by connecting the conductor patterns among the insulator layers, where the coil includes conductor pattern pairs each composed of two conductor patterns arranged so as to sandwich each insulator layer, and includes a first connecting portion connecting both end portions of the two conductor patterns so as to connect the two connecting patterns in parallel and a second connecting portion connecting a plurality of the conductor pattern pairs in series, where the first connecting portion and the second connecting portion are arranged so as to be displaced from each other in a direction of a line length of a coil pattern.

5 Claims, 12 Drawing Sheets

SIMULATION RESULT OF DIRECT-CURRENT RESISTANCE VALUE

| | DIRECT-CURRENT RESISTANCE [mΩ] | CHANGE RATIO |
|---|---|---|
| CONVENTIONAL EXAMPLE | 23.26 | - |
| FIRST EMBODIMENT | 23.84 | 2.50% |
| SECOND EMBODIMENT | 23.77 | 2.20% |
| MODIFIED EMBODIMENT | 24.86 | 6.90% |

Fig.10

LAMINATED ELECTRIC INDUCTOR

CROSS REFERENCE TO RELATED APPLICATIONS

This application is based on and claims the benefit of priority to Japanese Patent Application No. 2013-143315, filed on Jul. 9, 2013, the contents of which are hereby incorporated by reference in their entirety.

TECHNICAL FIELD

The present invention relates to a laminated electronic component where a circuit has been formed in a laminate obtained by laminating insulator layers and conductor patterns one on another.

BACKGROUND ART

According to size reduction and high performance of mobile equipment, as an inductor used in a power source circuit as a DC-DC converter application, a laminated power inductor advantageous for size reduction is being used. In recent years, there is a trend toward further great current, which results in requirement for a lower direct-current resistance characteristic as the specification for an inductor.

As the technique for lowering the direct-current resistance, there is setting a sectional area of an internal conductor large and a line length short. However, when the width of the conductor is made wide as the technique for making the sectional area large, an area through which magnetic flux passes decreases, which results in lowering of an inductance value. Further, when the thickness of the conductor is made large, the inductor tends to be affected by stress due to a difference in shrinkage ratio and a difference in shrinkage process between an internal conductor and a ferrite material during burning shrinkage, and a difference in linear shrinkage therebetween, or the like, which causes a structural defect such as a crack.

As a means for solving this problem, for example, a technique of connecting conductor patterns in parallel to reduce a direct-current resistance without setting the thickness of a conductor thick is disclosed in Japanese Unexamined Patent Application Publication, First Publication No. H8-130115. In the technique disclosed in Japanese Patent Application Laid-Open No. H08-130115, however, the conductor locally becomes significantly thick due to joining four upper and lower layers at conductor connecting portions, which results in such a problem that the locally thick portion tends to constitute a starting point for a structural defect such as a crack.

Further, in Japanese Patent Publication No. 4973996, a technique of combining a conductor pattern formed in ¾ turns to 1 turn and a conductor pattern formed in 1 turn to connect them in parallel is disclosed. In the technique disclosed in Japanese Patent Publication No. 4973996, however, there is such a problem that a portion where only one conductor pattern layer (a portion where the conductor patterns are not parallel) is provided exists, where a direct-current resistance considerably increases.

PRIOR ART LITERATURE

Patent Literatures

[Patent Literature 1] Japanese Unexamined Patent Publication, First Publication No. H8-130115

[Patent Literature 2] Japanese Patent Publication No. 4973996

SUMMARY OF THE INVENTION

One or more embodiments of the invention are to provide a laminated electronic component which can suppress occurrence of a structural defect such as a crack and includes a coil having a small direct-current resistance value.

This aspect of the invention solves the above problem by such a solving means as described below. It is to be noted that an explanation is made with reference marks corresponding to respective portions, members, and/or components in the embodiments of the invention in order to facilitate understanding but the present invention is not limited to these portions, members, and/or components.

First Embodiment

One or more embodiments of the invention are a laminated electronic component where insulator layers and conductor patterns are laminated one on another and a coil is formed in a laminate of the insulator layers and the conductor patterns by connecting the conductor patterns among the insulator layers, wherein the coil includes conductor pattern pairs each composed of two conductor patterns laminated and arranged so as to sandwich each insulator layer and includes a first connecting portion connecting both end portions of the two conductor patterns so as to connect the two conductor patterns in parallel and a second connecting portion connecting a plurality of sets of the conductor pattern pairs in series, where the first connecting portion and the second connecting portion are arranged so as to be displaced from each other in a direction of a line length of a coil pattern.

Second Embodiment

One or more embodiments of the invention are the laminated electronic component according to the First Embodiment, wherein the first connecting portion and the second connecting portion are arranged so as not to overlap with each other as viewed from a direction of the laminating.

Third Embodiment

One or more embodiments of this aspect of the invention are the laminated electronic component according to the First Embodiment, wherein the first connecting portion and the second connecting portion are arranged so as to partially overlap with each other as viewed from a direction of the laminating.

Fourth Embodiment

One or more embodiments of this aspect of the invention are the laminated electronic component according to any one of the first embodiment to the third embodiment, wherein the first connecting portion and the second connecting portion are arranged such that a current path of the coil is made linear in a section perpendicular to a laminating face and parallel to the line length direction by the first connecting portion at one of the conductor pattern pairs connected in series, at least one of two conductor patterns at the one of the conductor pattern pairs connected in series, the second connecting portion, at least one of two conductor patterns at the other of the conductor pattern pairs connected in series, and the first connecting portion at the other of the conductor pattern pairs connected in series.

Fifth Embodiment

One or more embodiments of this aspect of the invention are a laminated electronic component where insulator layers and conductor patterns are laminated one on another and a coil is formed in a laminate of the insulator layers and the conductor patterns by connecting the conductor patterns among the insulator layers, wherein the coil includes conductor pattern pairs each composed of two conductor patterns laminated and arranged so as to sandwich each insulator layer and includes a first connecting portion connecting both end portions of the two conductor patterns so as to connect the two conductor patterns in parallel and a second connecting portion connecting a plurality of the conductor pattern pairs in series, where the first connecting portion and the second connecting portion are arranged so as to be displaced from each other in a direction of a line length of a coil pattern such that a diagonal line of the first connecting portion and an diagonal line of the second connecting portion are positioned on the same diagonal line.

According to one or more embodiments of the invention, a laminated electronic component from which an extremely thick conductor connecting portion is excluded and which has a lower serial-current resistance value which can suppress occurrence of a structural defect such as a crack.

BRIEF DESCRIPTION OF DRAWINGS

FIG. 10 is a table showing a simulation result of respective comparisons in direct-current resistance value regarding the above-described conventional example, first embodiment, second embodiment and modified embodiment;

DETAILED DESCRIPTION OF PREFERRED EMBODIMENTS

Best mode for implementing the present invention will be explained with reference to the drawings or the like.

First Embodiment

Figure 1:
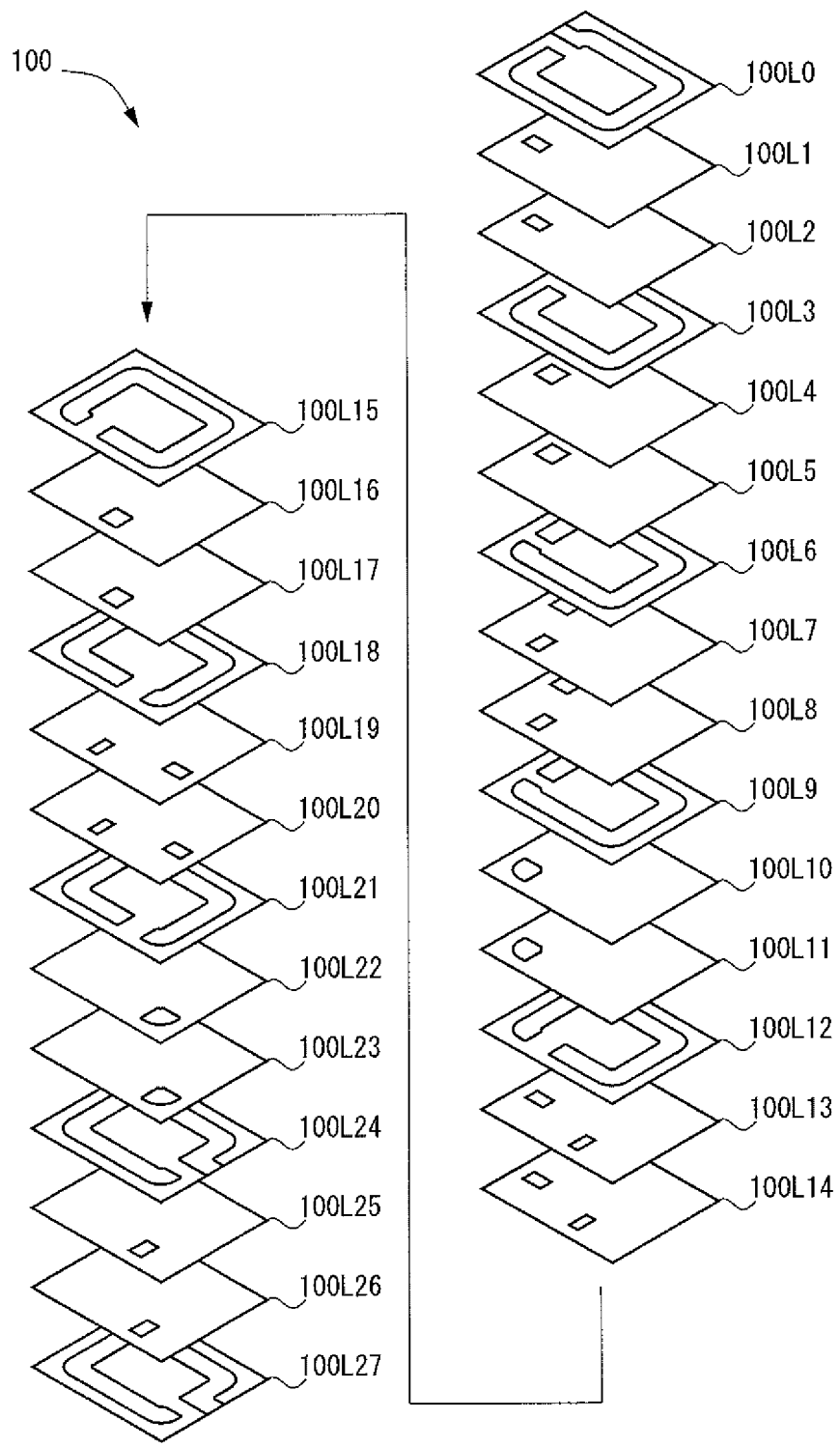
FIG. 1 is a perspective view showing a layer structure of a first embodiment of a laminated electronic component 100 according the first embodiments of the present invention.

FIG. 1 is a perspective view showing a layer configuration of a first embodiment of a laminated electronic component 100 according to the invention.

Figure 2:
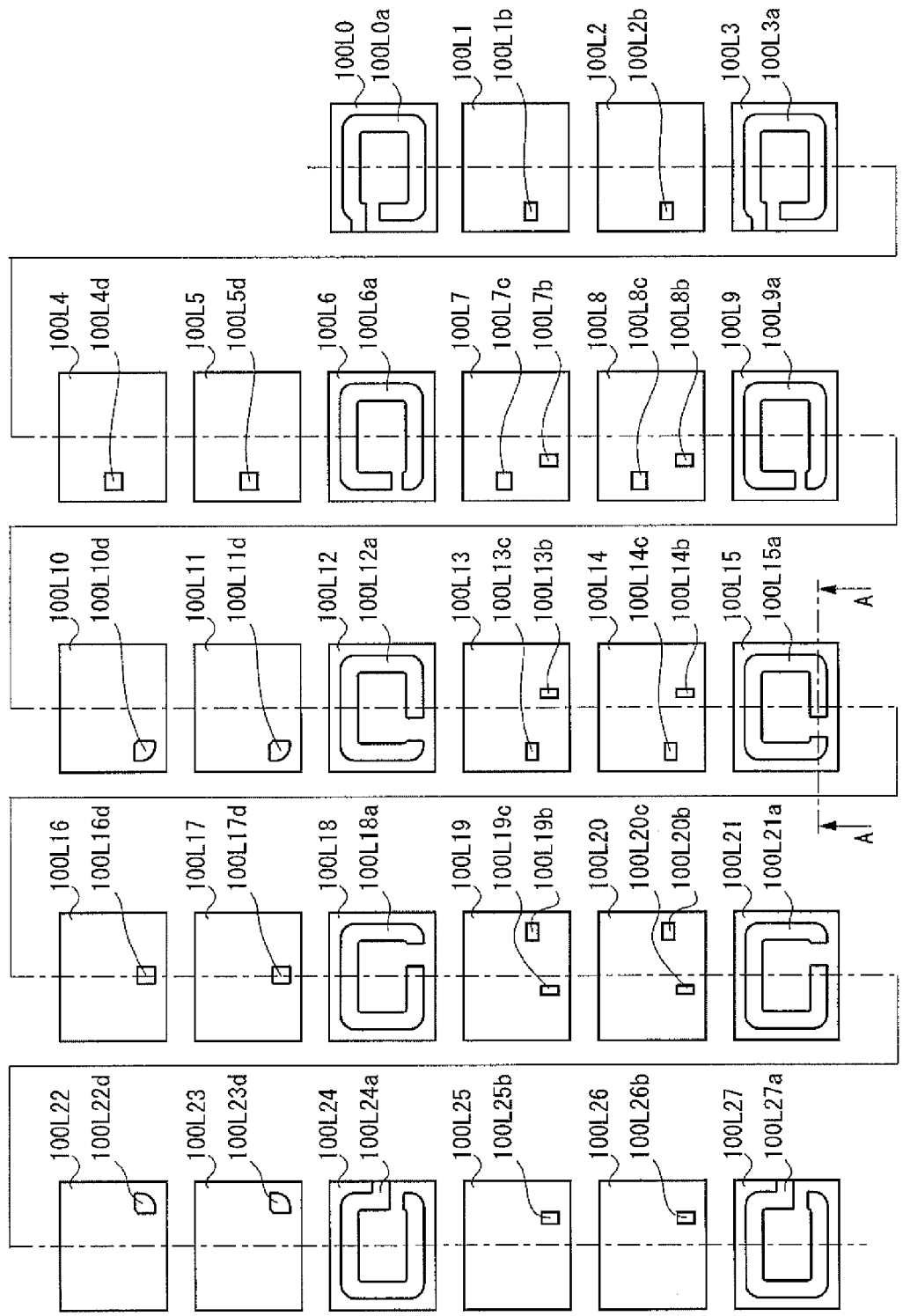
FIG. 2 is a plan view showing a state where respective layers of the laminated electronic component 100 according to the first embodiment have been arranged in a plane.

FIG. 2 is a plan view showing a state where respective layers of the laminated electronic component 100 according to the first embodiment have been arranged in a plane.

Figure 3:
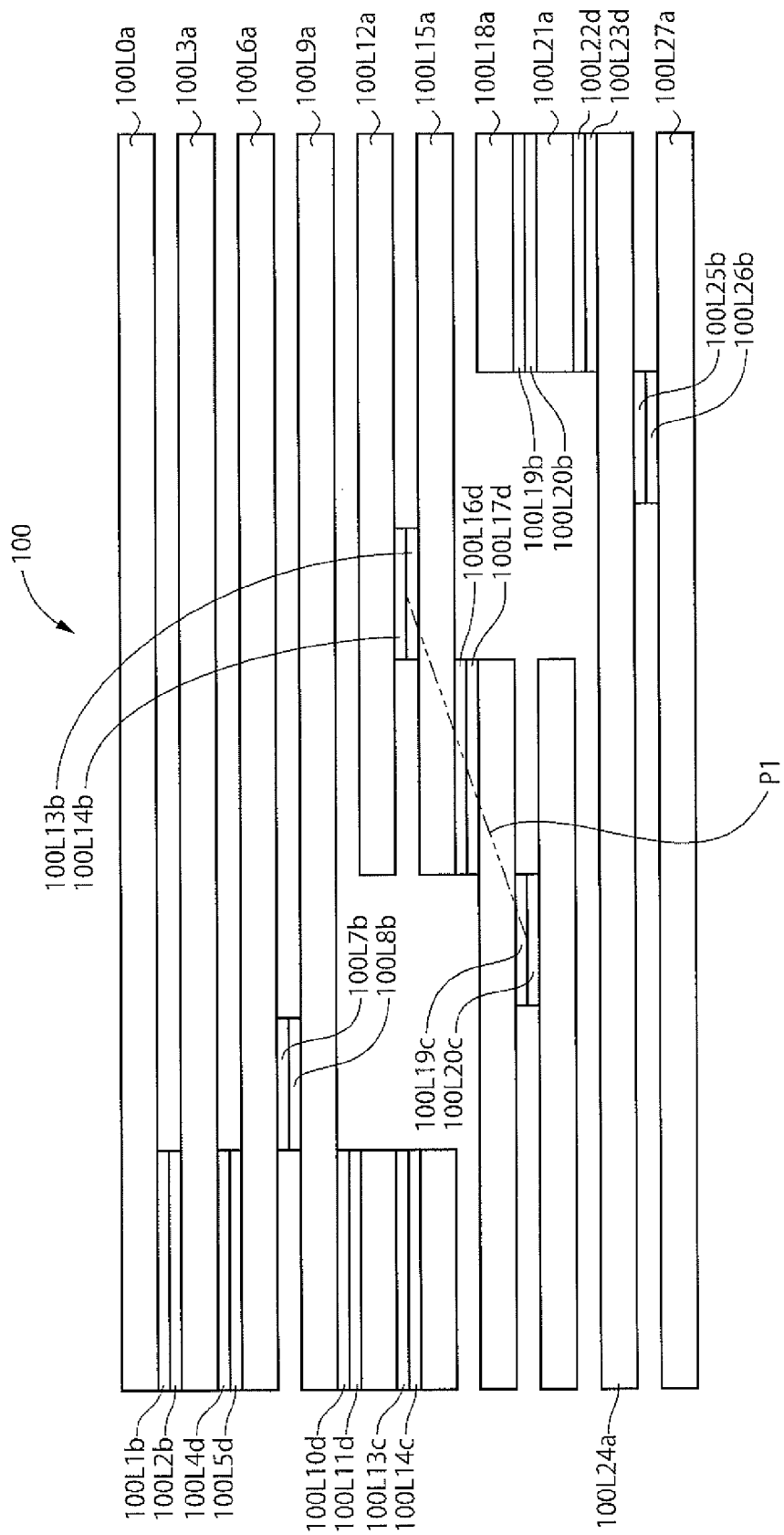
FIG. 3 is a sectional view showing respective laminated layers of the laminated electronic component 100 according to the first embodiment where insulator layers have been omitted in a cutting fashion.

FIG. 3 is a sectional view showing respective laminated layers of the laminated electronic component 100 according to the first embodiment where insulator layers have been omitted in a cutting manner. It is to be noted that FIG. 3 generally shows a section at a position shown by arrow A-A in FIG. 2, but it is not a correct section and shows a configuration positioned on a deeper side of a sheet face from a cutting position as a partially-perspective state. The configuration shown in a see-through fashion includes first connecting portions 100L1$b$, 100L2$b$, 100L13$c$, 100L14$c$, 100L19$b$ and 100L20$b$, and second connecting portions 100L4$d$ and 100L5$d$.

Respective figures including FIG. 1 to FIG. 3 are views schematically shown, where sizes and shapes of respective portions are exaggeratingly shown properly for easy understanding.

The following explanation is made while showing specific numerical values, shapes, materials, and the like, which can be properly modified.

The laminated electronic component 100 of the first embodiment is an inductor configured by laminating an insulator layer 100L0 to an insulator layer 100L2, conductor patterns 100L0$a$, 100L3$a$, 100L6$a$, 100L9$a$, 100L12$a$, 100L15$a$, 100L18$a$, 100L21$a$, 100L24$a$ and 100L27$a$, first connecting portions 100L1$b$, 100L2$b$, 100L7$b$, 100L7$c$, 100L8$b$, 100L8$c$, 100L13$b$, 100L13$c$, 100L14$b$, 100L14$c$, 100L19$b$, 100L19$c$, 100L20$b$, 100L20$c$, 100L25$b$ and 100L26$b$, and second connecting portions 100L4$d$, 100L5$d$, 100L10$d$, 100L11$d$, 100L16$d$, 100L17$d$, 100L22$d$ and 100L23$d$, and laminating an insulator layer for protection as an uppermost layer.

The insulator layer 100L0 to the insulator layer 100L27, and the insulator layer for protection are formed by using such an insulator as a magnetic material, a non-magnetic material or a dielectric.

The conductor patterns 100L0$a$, 100L3$a$, 100L6$a$, 100L9$a$, 100L12$a$, 100L15$a$, 100/18$a$, 100L21$a$, 100L24$a$ and 100L27$a$ (which are hereinafter called "conductor pattern(s) 100$a$" collectively) are formed using conductor paste obtained by making such a metal material as silver, silver-based material, gold, gold-based material or platinum into paste. The conductor pattern 100$a$ is formed in an approximately annular shape partially cut off. Further, the conductor pattern 100L0$a$ and the conductor pattern 100L3$a$, the conductor pattern 100L6$a$ and the conductor pattern 100L9a, the conductor pattern 100L12a and the conductor pattern 100L15a, the conductor pattern 100L18a and the conductor pattern 100L21a, and the conductor pattern 100L24a and the conductor pattern 100L27a are formed in the same shape for each pair, respectively, and the conductor patterns of each pair thereof are arranged so as to be superimposed on each other via an insulator layer to constitute a pair of conductor patterns.

The first connecting portions 100L1b, 100L2b, 100L7b, 100L7c, 100L8b, 100L8c, 100L13b, 100L13c, 100L14b, 100L14c, 100L19b, 100L19c, 100L20b, 100L20c, 100L25b and 100L26b (which are hereinafter called "first connecting portion(s) 100bc" collectively) are formed of a material similar to that of the conductor pattern 100a. The first connecting portion 100bc connects both end portions of two conductor patterns 100a arranged in parallel so as to connect the two conductor patterns 100a in parallel.

For example, the first connecting portion 100L13b and the first connecting portion 100L14b connect one ends of the conductor pattern 100L12a and the conductor pattern 100L15a to each other so as to connect the conductor pattern 100L12a and the conductor pattern 100L15a in parallel to each other. Further, the other ends of the conductor pattern 100L12a and the conductor pattern 100L15a are connected by the first connecting portion 100L13c and the first connecting portion 100L14c.

It is to be noted that regarding each pair of a conductor pattern pair composed of the conductor pattern 100L0a and the conductor pattern 100L3a, and a conductor pattern pair composed of the conductor pattern 100L24a and the conductor pattern 100L27a, one end sides thereof constitute inlet/outlet ports of a current path so that only one sides thereof are connected.

The second connecting portions 100L4d, 100L5d, 100L10d, 100L11d, 100L16d, 100L17d, 100L22d and 100L23d (which are hereinafter called "second connecting portion(s) 100d" collectively) are formed of a material similar to that of the conductor pattern 100a. The second connecting portions 100d connect a plurality of sets of conductor pattern pairs in series. For example, the second connecting portion 100L16d and the second connecting portion 100L17d connect the conductor pattern pair composed of the conductor pattern 100L12a and the conductor pattern 100L15a and the conductor pattern pair composed of the conductor pattern 100L18a and the conductor pattern 100L21a in series. The conductor pattern pairs are connected in series by the second connecting portions 100d so that a current path is formed in a quasi-spiral fashion and a function serving as a coil is provided.

In this embodiment, the respective layers described above are formed in a laminated fashion by printing. Therefore, connection of the conductor pattern 100a and the first connecting portion 100bc, and connection of the conductor pattern 100a and the second connecting portion 100d are provided by leaving portions of the insulator layers substantially serving as via holes without forming the insulator layers at the portions at a printing step for the insulator layers and filling, in these portions, materials constituting the respective connecting portions by printings. However, regarding these connections, connections in a layer direction may be performed utilizing a conventional method using via holes and plating, or the like. As a method for manufacturing respective layers, any technique can be adopted.

In the first embodiment, here, the first connecting portions 100bc and the second connecting portions 100d are arranged so as to be displaced from each other in a line length direction of the coil pattern. Specifically, the first connecting portions 100bc and the second connecting portions 100d are arranged such that projection shapes thereof as viewed from a laminating direction (a direction normal to a sheet face on FIG. 2; viewed above on FIG. 3) are not superimposed on each other. Thereby, such a state that a conductor locally becomes very thick due to many laminating numbers of the first connecting portions 100bc and the second connecting portions 100d can be avoided.

Further, even if the first connecting portions 100bc and the second connecting portions 100d are arranged as described above, the current path of the coil is secured in a necessary and sufficient fashion. That is, the first connecting portions 100bc and the second connecting portions 100d are arranged such that the current path becomes linear in FIG. 3 which shows a section perpendicular to the laminating face and parallel to the line length direction. More specifically, the current path of the coil is formed to be linear by the first connecting portion 100bc at one of the conductor patterns connected in series, at least one of two conductor patterns of the one of the conductor pattern pairs connected in series, the second connecting portion 100d, at least one of two conductor patterns of the other of the conductor pattern pairs connected in series, and the first connecting portions 100bc of the other of the conductor pattern pairs connected in series.

The above configuration will be described below while specific portions are being shown as examples. Here, a current path P1 formed at the second connecting portion 100L16d and the second connecting portion 100L17d connecting the conductor pattern pair composed of the conductor pattern 100L12a and the conductor pattern 100L15a and the conductor pattern pair composed of the conductor pattern 100L18a and the conductor pattern 100L21a to each other is adopted as an example. The current path P1 continues from the first connecting portions 100L13b and 100L14b to an end portion of the conductor pattern L15a, the second connecting portions 100L16d and 100L17d, and an end portion of the conductor pattern 100L18a, and extends up to the first connecting portions 100L19c and 100L20c linearly in section shown in FIG. 3. A current flows along the current path P1. Thereby, a current density becomes high on the current path P1 (a diagonal line from the first connecting portions 100L13b and 100L14b to the first connecting portions 100L19c and 100L20c) (a current concentrates on the vicinity of the current path P1), and the current density extremely lowers according to increase in distance from the current path P1. Therefore, since the current path P1 is secured in a linear fashion, even if the first connecting portion 100bc and the second connecting portion 100d are arranged so as to be displaced from each other in the line length direction of the coil pattern like this embodiment, flow of a current is not blocked. Accordingly, the direct-current value is prevented from reaching a high value. Thus, the laminated electronic component 100 of this embodiment has such a configuration that respective layers is arranged taking the current density distribution of respective connecting portions into consideration.

Here, a connection aspect conventionally used without applying the present invention will be shown for comparison with this embodiment.

Figure 4:
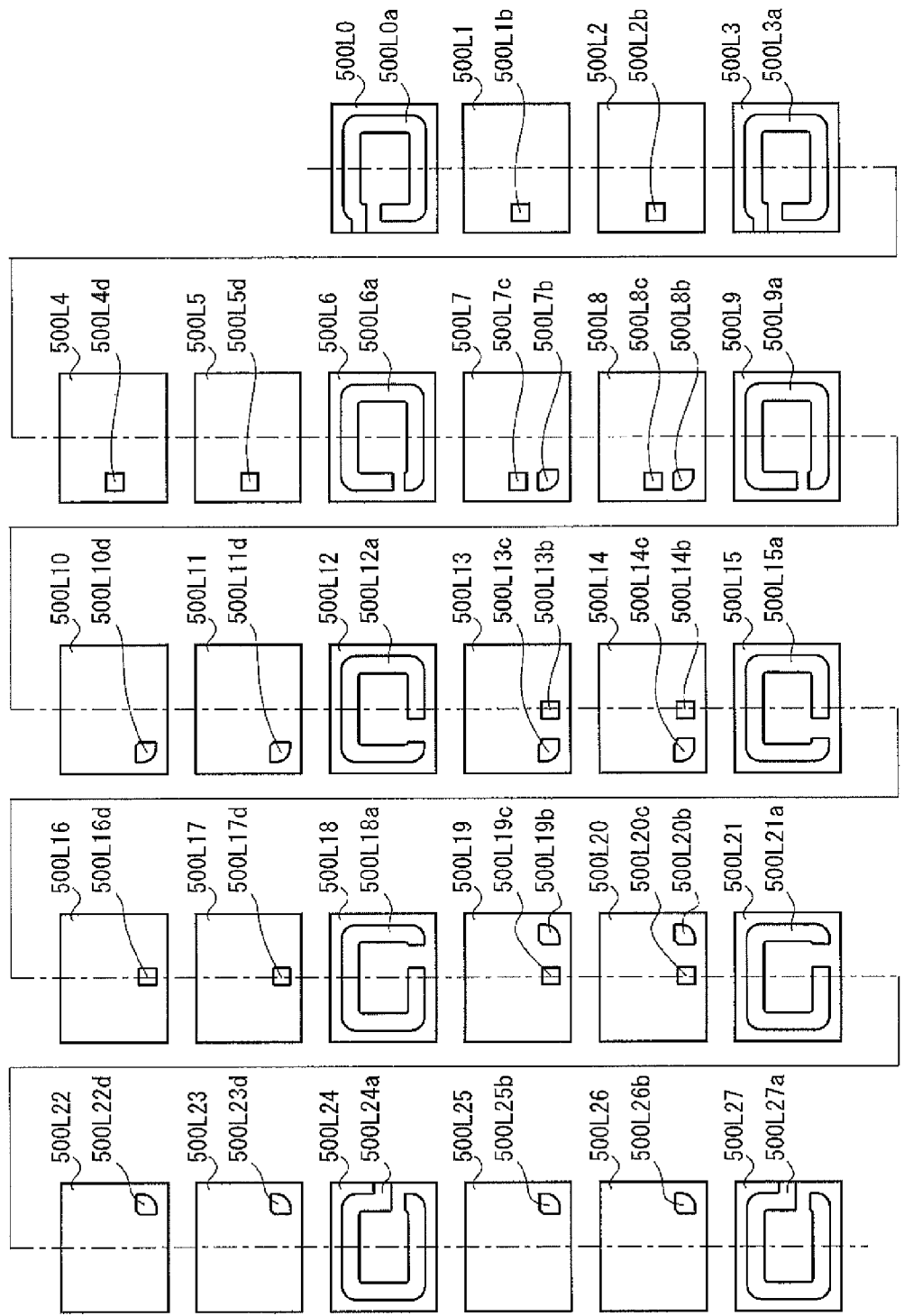
FIG. 4 is a plan view showing a state where respective layers of a conventional laminated electronic component 500 have been arranged in a plane.

FIG. 4 is a plan view showing a state where respective layers of a conventional laminated electronic component 500 have been arranged in a plane.

Figure 5:
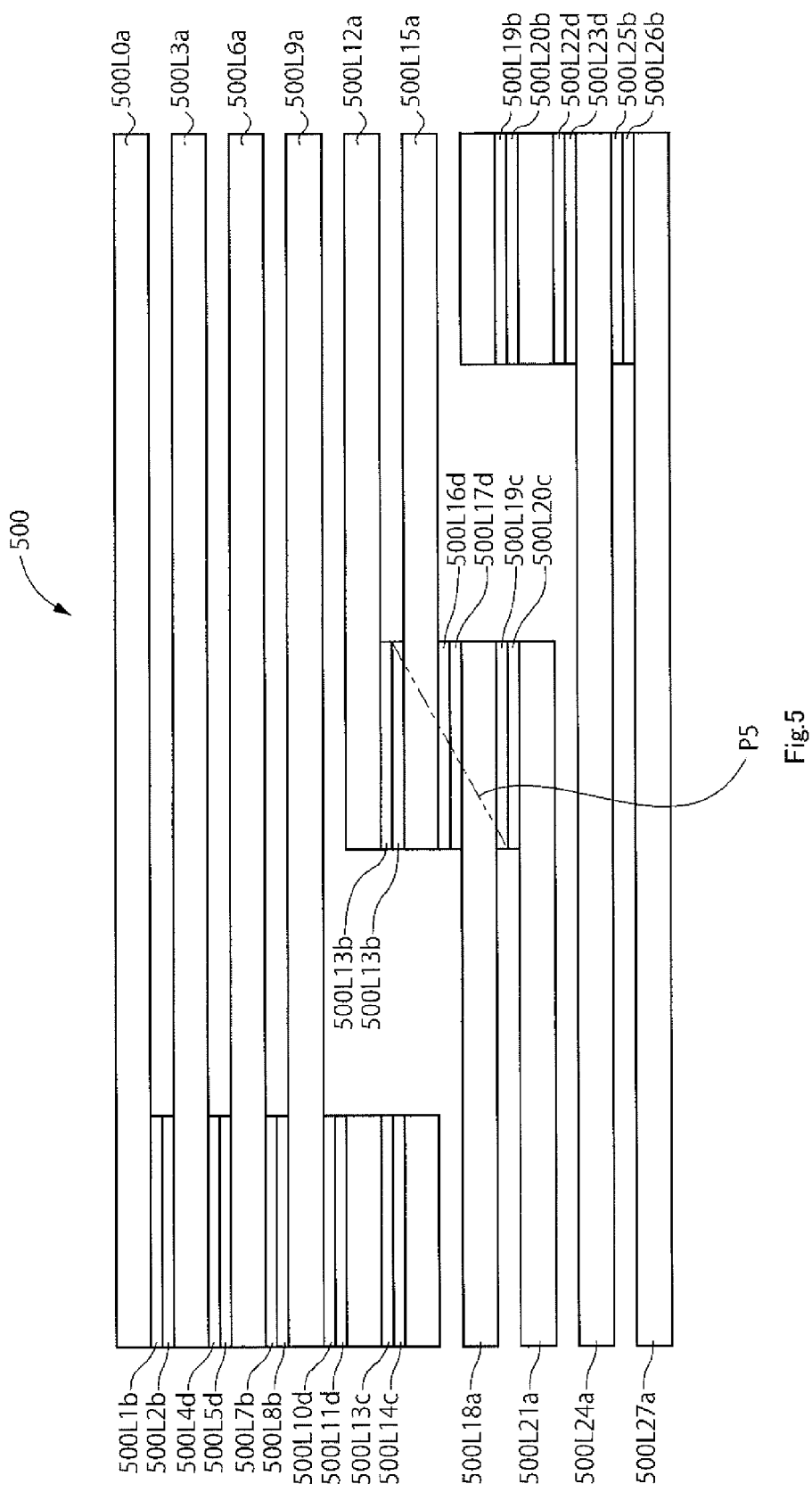
FIG. 5 is a sectional view showing respective laminated layers of the conventional laminated electronic component 500 where insulator layers have been omitted in a same cutting fashion as that in FIG. 3.

FIG. 5 is a sectional view showing respective laminated layers of the conventional laminated electronic component 500 where insulator layers have been omitted in a same cutting manner as that in FIG. 3.

It is to be noted that portions performing same functions as those of the above-described first embodiment in the conventional laminated electronic component 500 are attached with same reference marks and repetitive explanation thereof is omitted.

Conductor patterns 500*a* of the conventional laminated electronic component 500 described here have the same shapes as those of the conductor patterns 100*a* of the first embodiment. The first connecting portions 500*bc* and the second connecting portions 500*d* are not displaced from each other in a line length direction of a coil pattern.

In this conventional structure, a current flows along a current path P5 shown in FIG. 5. However, at a position far from the current path P5, a current density is put in a lowered state, and many regions which are utilized as the current path are present. In the conventional structure, a portion where many conductors have been laminated occupies a large region. For example, there exists a large region where ten conductor layers including the conductor patterns 500L12*a*, 500L15*a*, 500L18*a*, and 500L21*a* have been laminated in total in a portion corresponding to the second connecting portions 500L16*d* and 500L17*d* in a vertical direction in FIG. 5. When the number of conductor patterns to be laminated is counted, four layers of conductor patterns have been laminated in total. Thereby, the portion where the conductors have been laminated is easily affected by a stress due to a difference in shrinkage ratio and a different in shrinkage process between a conductor and a ferrite material at a burning shrinkage time, and a difference in linear shrinkage therebetween, or the like, which causes structural defect such as a crack or the like.

On the other hand, in this embodiment, the first connecting portions 100*bc* and the second connecting portions 100*d* are arranged so as to be displaced from each other in the line length direction of the coil pattern. Thereby, it is made possible to secure the shortest distance in a linear line fashion as a minimum current path required, and an ideal conductors-bonded structure satisfying electric properties required can be obtained. When the number of conductor patterns laminated at a portion connected with a conductor is counted, only two layers have been laminated in total, so that the laminated electronic component 100 of this embodiment can suppress a structural defect such as a crack.

Second Embodiment

Figure 6:
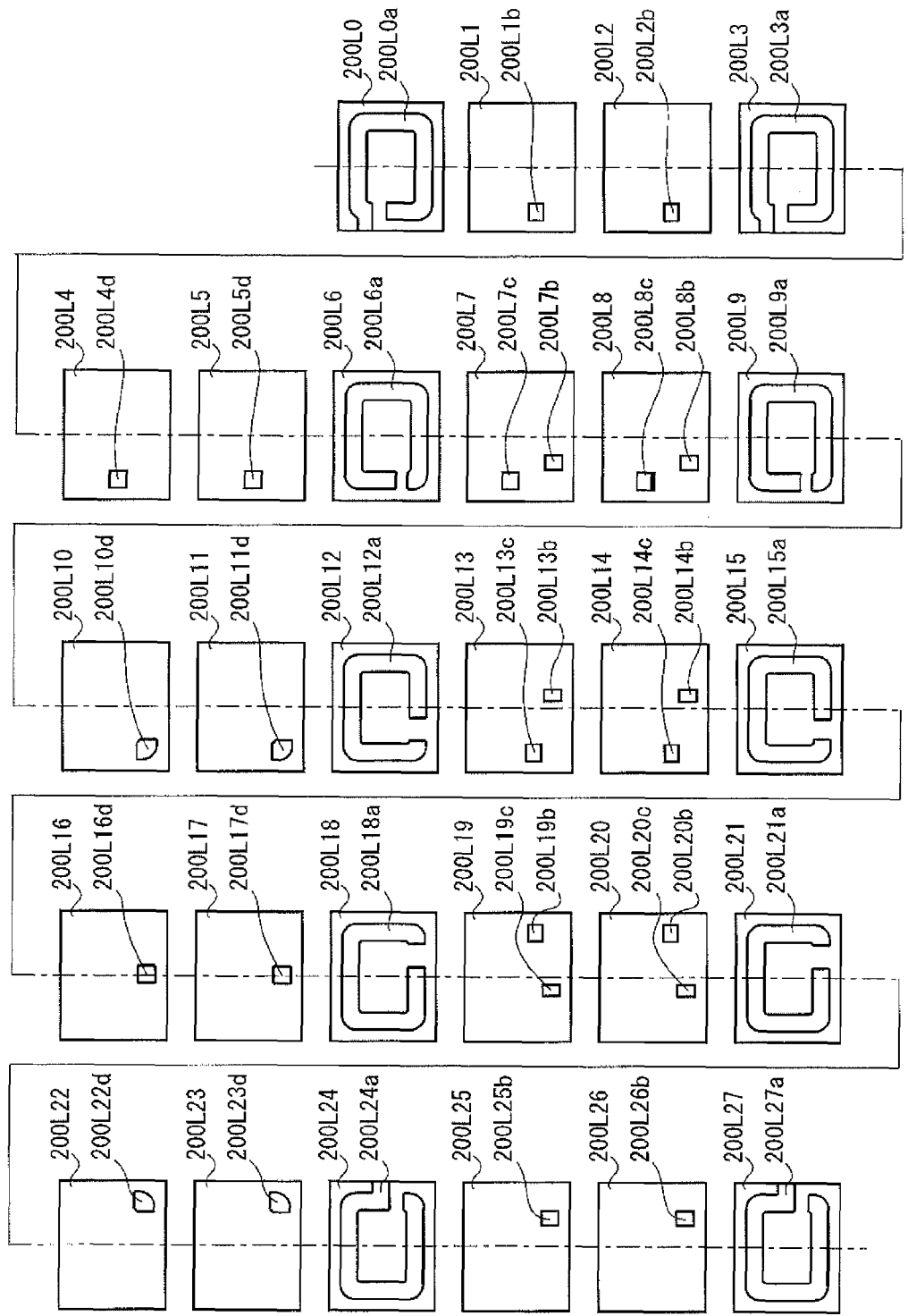
FIG. 6 is a plan view showing a state where respective layers of a laminated electronic component 200 according to a second embodiment have been arranged in a plane.

FIG. 6 is a plan view showing a state where respective layers of a laminated electronic component 200 according to a second embodiment have been arranged in a plane.

Figure 7:
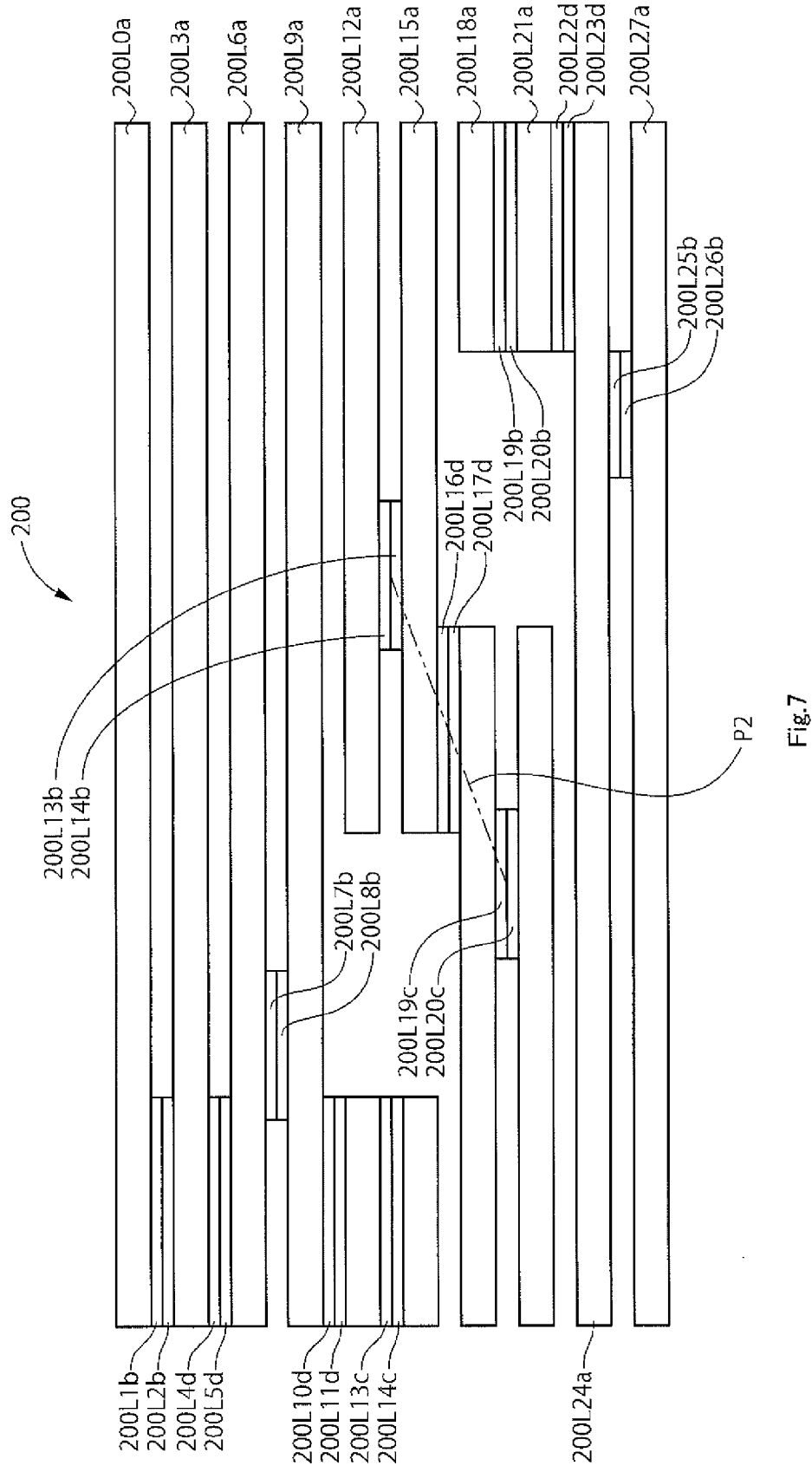
FIG. 7 is a sectional view showing respective laminated layers of the laminated electronic component 200 according to the second embodiment where insulator layers have been omitted in a cutting fashion.

FIG. 7 is a sectional view showing respective laminated layers of the raminated electronic component 200 according to the second embodiment where insulator layers have been omitted in a cutting manner.

FIG. 6 and FIG. 7 show views similar to those in FIG. 2 and FIG. 3 in the above-described first embodiment. It is to be noted that the ends of portions performing same functions as those of the above-described first embodiment in the laminated electronic component 200 of the second embodiment are attached with same reference marks and repetitive explanation thereof is omitted.

The laminated electronic component 200 of the second embodiment is different from the laminated electronic component 100 of the first embodiment in such a point that first connecting portions 200*bc* and second connecting portions 200*d* are arranged so as to slightly overlap with each other in the former. It is to be noted that the conductor patterns 200*a* have the same shape as those of the conductor patterns 100*a* of the first embodiment.

Specifically speaking, the first connecting portions 200L13*b* and 200L14*b*, and the second connecting portions 200L16*d* and 200L17*d* are arranged so as to overlap with each other in the line length direction by 20 µm. Similarly, the first connecting portions 200L19*c* and 200L20*c* and the second connecting portions 200L16*d* and 200L17*d* are arranged so as to overlap with each other in the line length direction by 20 µm. Thereby, a current path P2 is formed in the same manner as the current path P1 of the first embodiment, but a sectional area perpendicular to the current path P2 at a portion overlapping with each connecting portion is increased as compared with that of the first embodiment. Therefore, this embodiment is effective for such a case that the portion constitutes a bottleneck (barrier) so that a direct-current resistance value is made high.

Further, in the second embodiment, portions partially overlapping with each other occur, but the occupation ratio of the portions is extremely small as compared with that of the conventional configuration having a complete overlapping. Therefore, an effect for suppressing a structural defect such as a crack is sufficiently high.

Modified Embodiment

Figure 8:
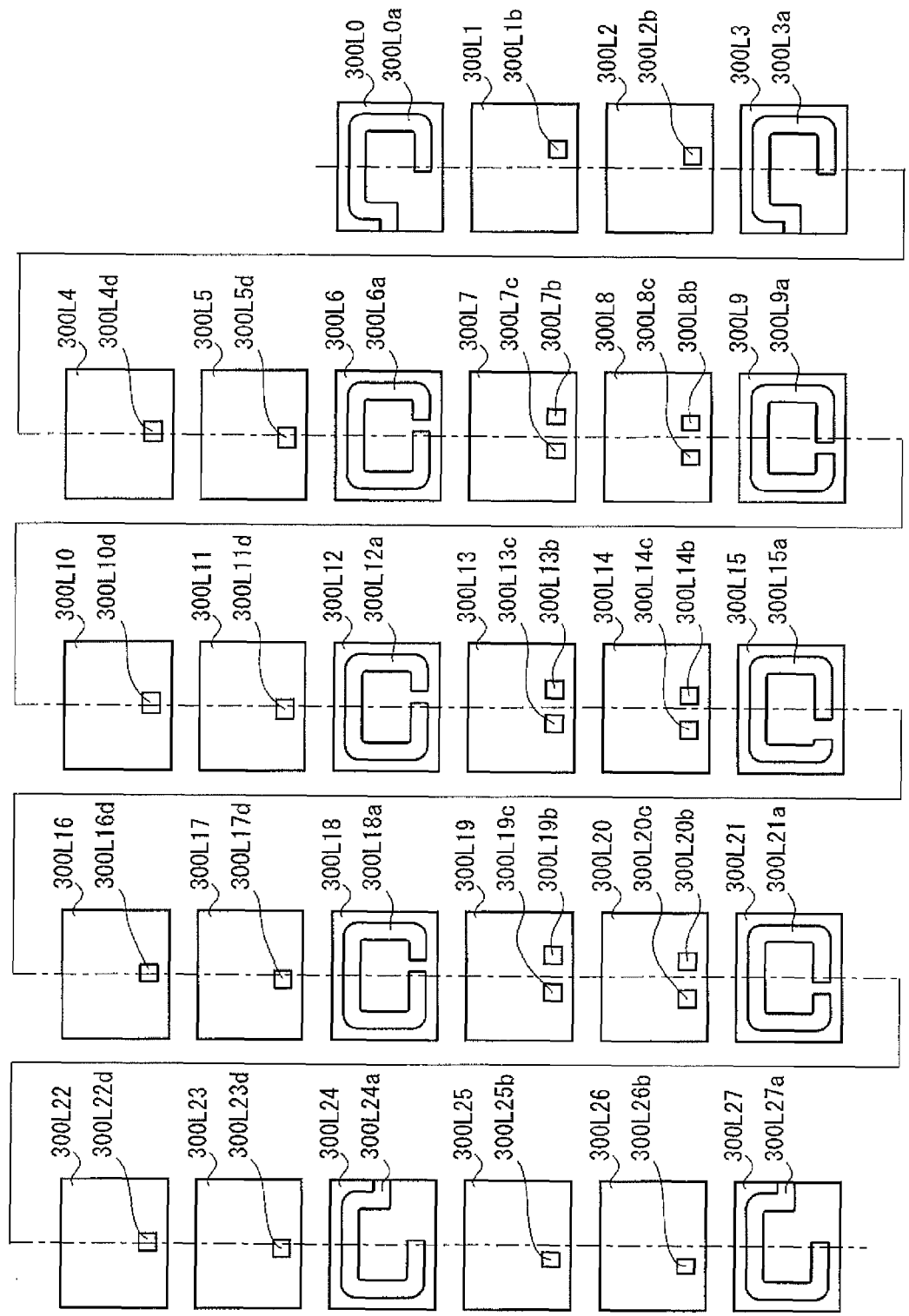
FIG. 8 is a plan view showing a state where respective layers of a laminated electronic component 300 according to a modified embodiment have been arranged in a plane.

FIG. 8 is a plan view showing a state where respective layers of a laminated electronic component 300 according to a modified embodiment have been arranged in a plane.

Figure 9:
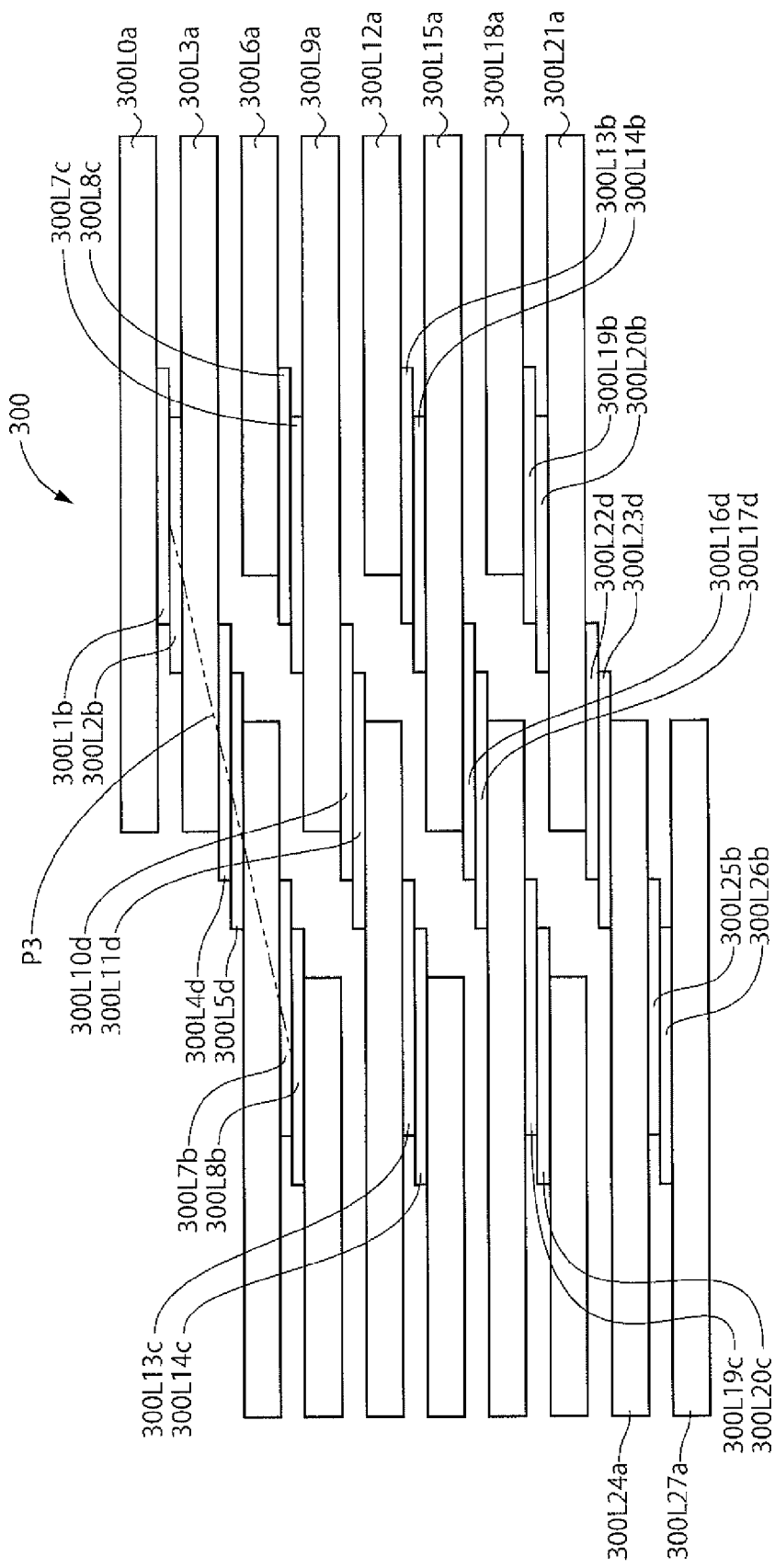
FIG. 9 is a sectional view showing respective laminated layers of the laminated electronic component 300 according to the modified embodiment where insulator layers have been omitted in a cutting fashion.

FIG. 9 is a sectional view showing respective laminated layers of the laminated electronic component 300 according to the modified embodiment where insulator layers have been omitted in a cutting manner.

FIG. 8 and FIG. 9 show views similar to those in FIG. 2 and FIG. 3 in the above-described first embodiment. It is to be noted that the ends of portions performing same functions as those of the above-described first embodiment in the laminated electronic component 300 of the third embodiment are attached with same reference marks and repetitive explanation thereof is omitted.

The first connecting portion 100*bc* and the second connecting portion 100*d* in the first embodiment each have a laminated structure of two layers but the two layers are completely laminated at the same position in an overlapping fashion. On the other hand, in the laminated electronic component 300 of the modified embodiment, a first connecting portion 300*bc* and a second connecting portion 300*d* each have a configuration where two layers are arranged so as to be displaced from each other.

Specifically, for example, a first connecting portion 300L1*b* and the first connecting portion 300L2*b* are arranged so as be displaced from each other in the line length direction. Similarly, a second connecting portion 300L4*d* and a second connecting portion 300L5*d* are arranged so as be displaced from each other in the line length direction. Such arrangement is determined so as to satisfy such a positional relationship that a current path P3 is formed of a linear line. Therefore, in the laminated electronic component 300 of the modified embodiment, the line length of the coil pattern can be made longer than those in the first embodiment and the second embodiment in addition to the effects obtained by the first embodiment and the second embodiment, and in a laminate incorporating a coil pattern having many turns, the height of the laminate can be reduced corresponding to the line length.

It is to be noted that conductor patterns 300a are different in shape from the conductor patterns 100a of the first embodiment.

Comparison of the Respective Embodiments and the Conventional Example

FIG. 10 is a table showing a simulation result where direct-current resistance values are compared regarding the above-described conventional example, first embodiment, second embodiment, and modified embodiment.

As described above, all of the first embodiment, the second embodiment, and the modified embodiment are much higher in suppression effect to occurrence of such a structural defect as a crack than the conventional configuration. On the other hand, it can be confirmed that increase of the direct-current resistance value is only slight in all of the first embodiment, the second embodiment, and the modified embodiment.

Other Modified Embodiments

The present invention is not limited to the above-described embodiments, and various variations and/or changes can be adopted in the present invention, but these variations and/or changes can be included in a scope of the present invention.

(1) In the first embodiment and the second embodiment, the examples where each connecting portion has a structure of two layers have been explained but the present invention is not limited to this structure and each connecting portion may be composed of a single layer.

Figure 11:
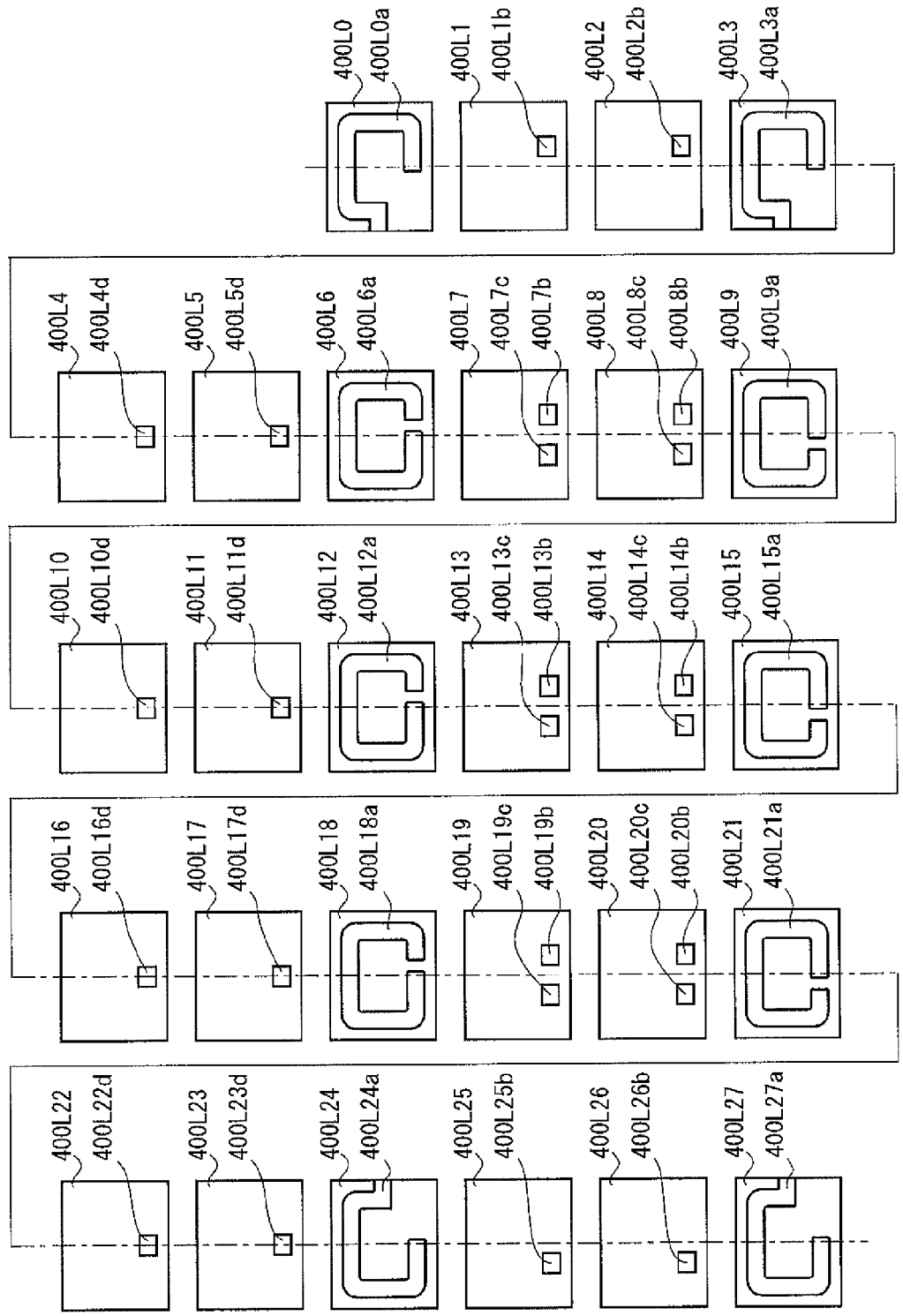
FIG. 11 is a plan view showing a state where respective layers of a laminated electronic component of another embodiment have been arranged in a plane.
Figure 12:
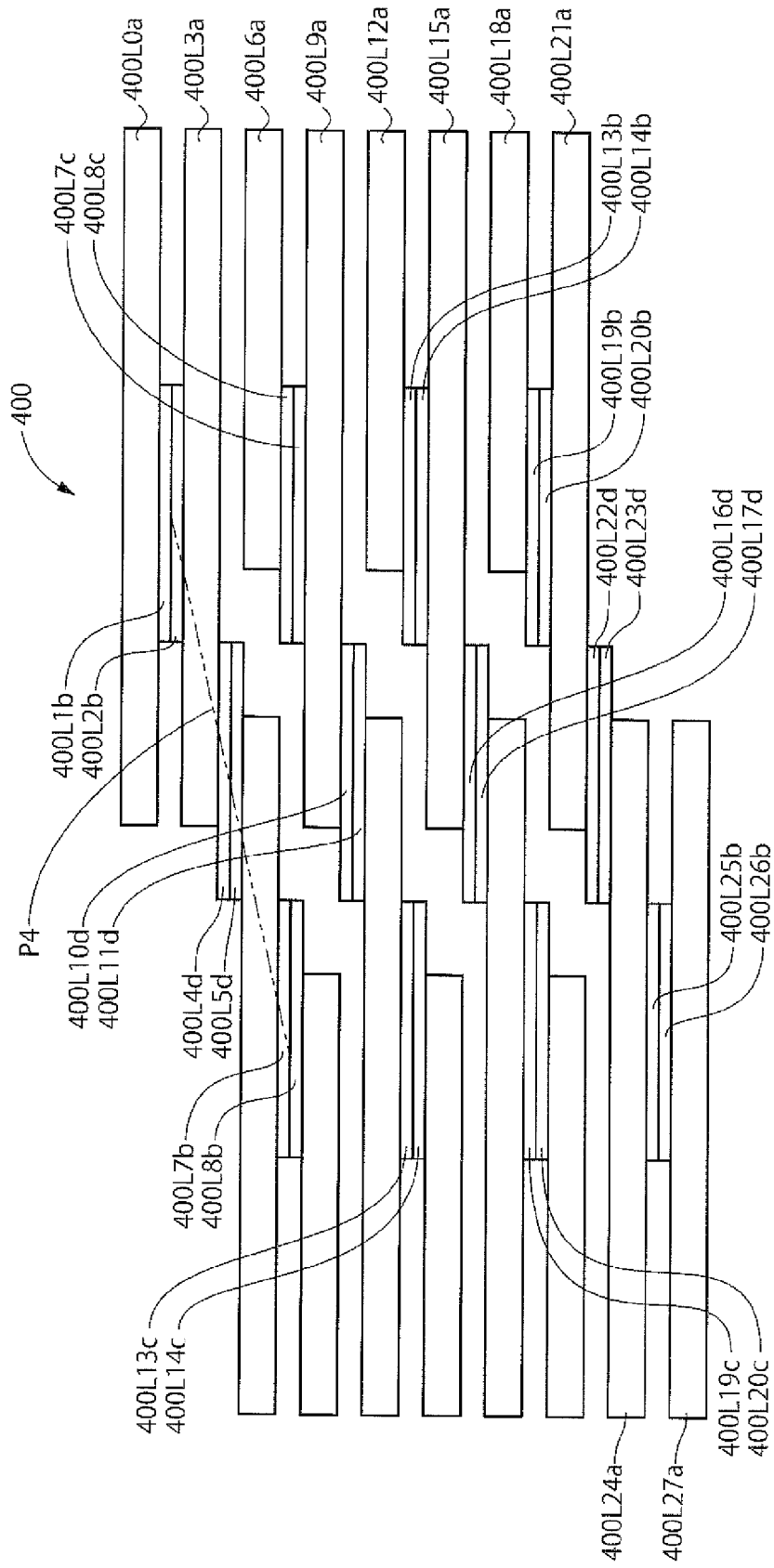
FIG. 12 is a sectional view showing respective laminated layers of the laminated electronic component according to the another embodiment where insulator layers have been omitted in a cutting fashion.

(2) In the modified embodiment, the first connecting portion and the second connecting portion are each arranged such that two layers are displaced from each other, but these two layers may be arranged at the same position in a laminated fashion, as shown in FIG. 11 and FIG. 12. It is to be noted that the ends of portions performing same functions as those of the above-described first embodiment in a laminated electronic component 400 of the modified embodiment are attached with same reference marks and repetitive explanation thereof is omitted.

(3) In the first embodiment, the second embodiment, and the modified embodiment, the inductors have been explained as examples of the laminated electronic component. The present invention is not limited to the inductors and it may be applied to such a case that a coil is formed in a portion of a multilayer substrate, and the present invention can be applied to various laminated electronic components.

It is to be noted that the respective embodiments and the modified embodiments can be properly combined to be used, but detailed explanation about the combinations is omitted. Further, the present invention is not limited to the respective embodiments explained above.

REFERENCE MARKS IN THE DRAWINGS

100, 200, 300, 400, and 500: laminated electronic component
100L0 to 100L27, 200L0 to 200L27, 300L0 to 300L27, 400L0 to 400L27, and 500L0 to 500L27: insulator layer
100a, 200a, 300a, 400a, and 500a: conductor pattern
100bc, 200bc, 300bc, 400bc, and 500bc: first connecting portion
100d, 200d, 300d, 400d, and 500d: second connecting portion
P1, P2, P3, P4, and P5: current path

The invention claimed is:

1. A laminated electronic component where insulator layers and conductor patterns are laminated one on another and a coil is formed in a laminate of the insulator layers and the conductor patterns by connecting the conductor patterns among the insulator layers, wherein the coil includes a plurality of conductor pattern pairs each composed of two conductor patterns laminated and arranged so as to sandwich each insulator layer, and includes a plurality of first connecting portions so as to pair up with the plurality of conductor patterns, the first connecting portion connecting both end portions of the two conductor patterns which configure the conductor pattern pair of same conductor pattern set so as to connect the two conductor patterns in parallel and includes a second connecting portion connecting a plurality of sets of the conductor pattern pairs in series, wherein the two conductor patterns which configure the conductor pattern set are arranged so as to be displaced from each other in a direction of a line length of a coil pattern, the first connecting portion having a laminated structure of multiple layers displaced from each other in a direction of a line length of a coil pattern, the second connecting portion having a laminated structure of multiple layers displaced from each other in a direction of a line length of a coil pattern, and wherein the multiple layers configuring the first connecting portion, the multiple layers configuring the second connecting portion, a portion of the coil pattern connected to the multiple layers configuring the first connecting portion, and a portion of the coil pattern connected to the multiple layers configuring the second connecting portion are formed to be linear, wherein the plurality of first connecting portions and the second connecting portion are arranged so as not to overlap with each other as viewed from a direction of the laminating, and wherein the plurality of first connecting portions, the second connecting portion, and one of the conductor pattern pairs are arranged such that a current path of the coil is made linear in a section perpendicular to a laminating face and parallel to the line length direction by the first connecting portion at the one of the conductor pattern pairs connected in series.

2. The laminated electronic component according to claim 1, wherein the plurality of first connecting portions, the second connecting portion, and one of the conductor pattern pairs are arranged such that a current path of the coil is made linear in a section perpendicular to a laminating face and parallel to the line length direction by the plurality of first connecting portions at the one of the conductor pattern pairs connected in series.

3. The laminated electronic component according to claim 1, wherein the plurality of first connecting portions and the second connecting portion are arranged so as to partially overlap with each other as viewed from a direction of the laminating.

4. The laminated electronic component according to claim 3, wherein the plurality of first connecting portions, the second connecting portion, and one of the conductor pattern pairs are arranged such that a current path of the coil is made linear in a section perpendicular to a laminating face and parallel to the line length direction by the plurality of first connecting portions at the one of the conductor pattern pairs connected in series.

5. A laminated electronic component where insulator layers and conductor patterns are laminated one on another and a coil is formed in a laminate of the insulator layers and the conductor patterns by connecting the conductor patterns among the insulator layers, wherein the coil includes a plurality of conductor pattern pairs each composed of two conductor patterns laminated and arranged so as to sandwich each insulator layer, and includes a plurality of first connecting portions so as to pair up with the plurality of conductor patterns, the first connecting portion connecting both end portions of the two conductor patterns which configure the conductor pattern pair of same conductor pattern set so as to connect the two conductor patterns in parallel and includes a second connecting portion connecting a plurality of sets of the conductor pattern pairs in series, wherein the two conductor patterns which configure the conductor pattern set are arranged so as to be displaced from each other in a direction of a line length of a coil pattern, the first connecting portion having a laminated structure of multiple layers displaced from each other in a direction of a line length of a coil pattern, the second connecting portion having a laminated structure of multiple layers displaced from each other in a direction of a line length of a coil pattern, and wherein the multiple layers configuring the first connecting portion, the multiple layers configuring the second connecting portion, a portion of the coil pattern connected to the multiple layers configuring the first connecting portion, and a portion of the coil pattern connected to the multiple layers configuring the second connecting portion are formed to be linear and wherein the plurality of first connecting portions and the second connecting portion are arranged so as to be displaced from each other in a direction of a line length of a coil pattern such that a diagonal line of the plurality of first connecting portions and a diagonal line of the second connecting portion are positioned on the same diagonal line, wherein the plurality of first connecting portions and the second connecting portion are arranged so as not to overlap with each other as viewed from a direction of the laminating, and wherein the plurality of first connecting portions, the second connecting portion, and one of the conductor pattern pairs are arranged such that a current path of the coil is made linear in a section perpendicular to a laminating face and parallel to the line length direction by the first connecting portion at the one of the conductor pattern pairs connected in series.

* * * * *